United States Patent [19]

Yamaguchi

[11] Patent Number: 5,760,619

[45] Date of Patent: Jun. 2, 1998

[54] PIEZOELECTRIC TRANSFORMER DRIVER CIRCUIT

[75] Inventor: Syuuji Yamaguchi, Tokyo, Japan

[73] Assignee: NEC Corporation, Tokyo, Japan

[21] Appl. No.: 703,355

[22] Filed: Aug. 26, 1996

[30] Foreign Application Priority Data

Aug. 30, 1995 [JP] Japan ................................. 7-220961

[51] Int. Cl.$^6$ ........................................................ H03B 1/00
[52] U.S. Cl. ............................................. 327/110; 327/304
[58] Field of Search ..................................... 327/300, 301, 327/302, 304, 110, 308, 65, 423, 424, 108, 427, 432, 434, 437, 374–377

[56] References Cited

U.S. PATENT DOCUMENTS

| | | | |
|---|---|---|---|
| 3,213,295 | 10/1965 | Etal | 327/110 |
| 3,770,986 | 11/1973 | Drehle | 327/110 |
| 5,304,863 | 4/1994 | Cargille | 327/110 |
| 5,414,309 | 5/1995 | Ichikawa et al. | 327/110 |
| 5,548,189 | 8/1996 | Williams | 315/224 |

FOREIGN PATENT DOCUMENTS

| | | |
|---|---|---|
| 56-68277 | 6/1981 | Japan. |
| 59-74728 | 4/1984 | Japan. |
| 59-127422 | 7/1984 | Japan. |
| 59-159676 | 9/1984 | Japan. |

*Primary Examiner*—Timothy P. Callahan
*Assistant Examiner*—My-Trang Nu Ton
*Attorney, Agent, or Firm*—Sughrue, Mion, Zinn, Macpeak & Seas, PLLC

[57] ABSTRACT

A piezoelectric transformer driver circuit can employ low voltage transistors. By alternately turning ON and OFF switching transistors b 3 and 4 depending upon gate signals GA and GB, a primary side of a piezoelectric transformer 7 is driven, and a secondary side is connected to a load 8. Inductors 1 and 2 are provided corresponding to transistors 3 and 4 for supplying a power source to corresponding transistors. Capacitors 10 and 11 respectively connected to one of the electrode of the inductors 1 and 2, respectively. The transistor 12 is turned ON upon completion of ON/OFF operation of the transistors 3 and 4, and the capacitors 10 and 11 are situated the other electrode at the ground voltage. Upon completion of ON/OFF operation of the transistor, a surge voltage to be generated by the inductors 1 and 2 can be restricted to permit use of the low voltage transistor. Thus, the overall circuit can be compact and low cost.

14 Claims, 11 Drawing Sheets

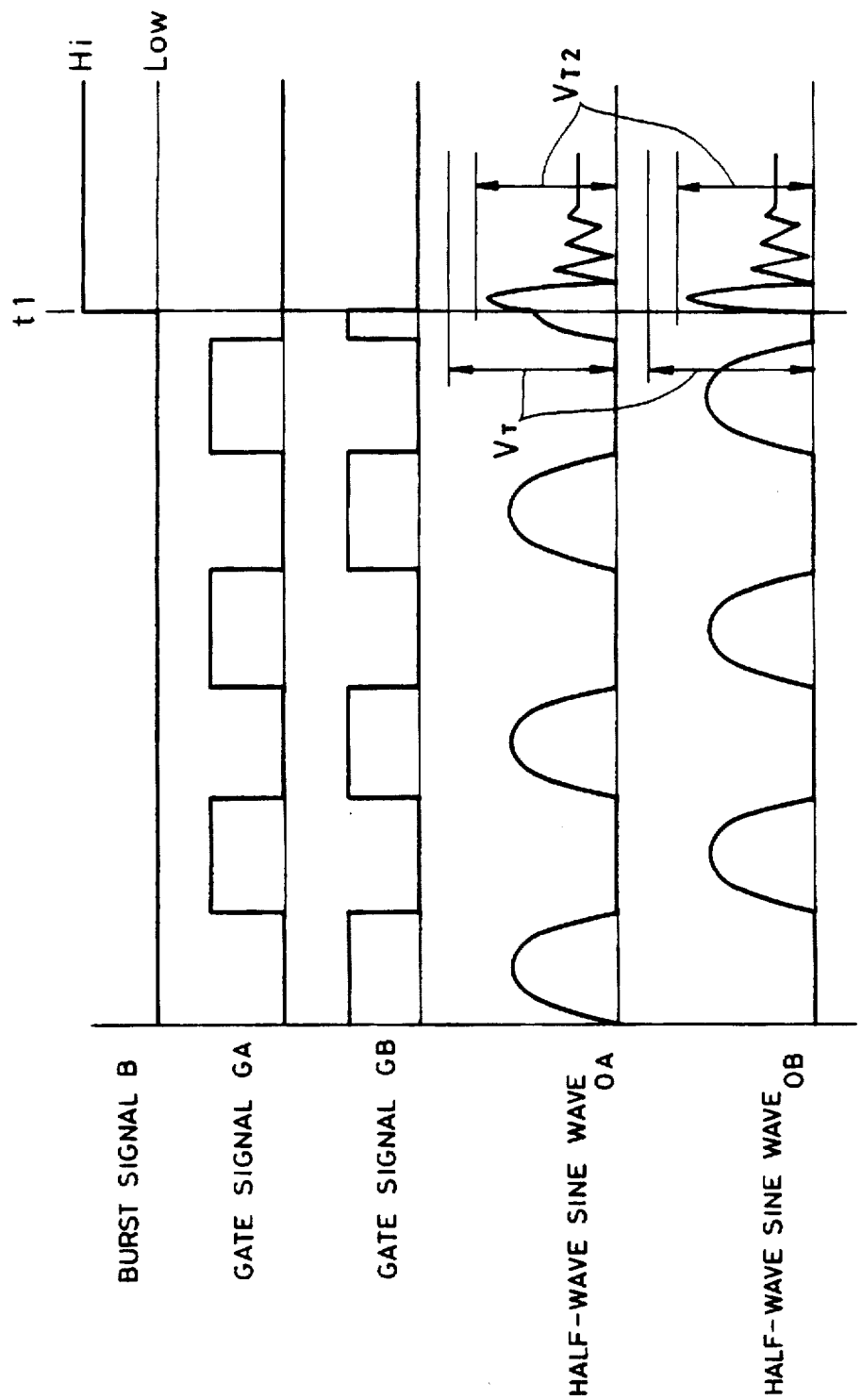

PIEZOELECTRIC TRANSFORMER DRIVER CIRCUIT

BACKGROUND OF THE INVENTION

1. Field of the Invention

The present invention relates to a piezoelectric transformer driver circuit. More specifically, the invention relates to a piezoelectric transformer driver circuit for driving a fluorescent lamp and a neon lamp.

2. Description of the Related Art

A typical application of an inverter employing a piezoelectric transformer is illumination of a cold cathode fluorescent lamp. In such case, in order to vary luminance in illumination of the cold cathode fluorescent lamp, a current flowing through the lamp has to be controlled.

A typical method for controlling the current flowing in the lamp is to control a voltage to be supplied to the cold cathode fluorescent lamp. When the voltage to be supplied to the cold cathode fluorescent lamp is lowered, the current flowing through the lamp is reduced correspondingly to vary the luminance of the lamp.

However, when a large amount of floating capacity C is present in the cold cathode fluorescent lamp as shown in FIG. 7, the current I flowing through the cold cathode fluorescent lamp becomes smaller at lower voltage side. In other words, influence of the floating capacity C is greater at smaller current in the lamp. Therefore, when the luminance is lowered by reducing the current I in the lamp, the lower voltage side of the lamp becomes darker than that in the higher voltage side.

Then, as a method for varying the luminance of the cold cathode fluorescent lamp with avoiding the problem to be encountered in the system of controlling voltage, there is a method to perform burst control. This is the method in which driving of the cold cathode fluorescent lamp is temporarily interrupted for a period not perceptible by human eye to nominally lower the luminance by equivalently restrict the current in the lamp. Namely, by varying the period to holding interruption of driving of the cold cathode fluorescent lamp, the luminance is varied. In this system, since sufficiently large current flows in the lamp while the cold cathode fluorescent lamp is illuminated, influence of the current flowing through the floating capacity in the cold cathode fluorescent lamp can be eliminated. Also, the problem to make the lower voltage side darker in the cold cathode fluorescent lamp will never be caused.

Here, one example of a circuit for performing burst control in a piezoelectric transformer inverter (piezoelectric transformer driver circuit) in the prior art is illustrated in FIG. 8. The shown circuit includes inductor 1 and 2 connected a power source 9 at one end, respectively, switching transistors 3 and 4 connected between the other end of the inductances 1 and 2 and the ground, a piezoelectric transformer 7 having a primary side connected between a junction of the inductor 1 and the switching transistor 3, and a junction of the inductor 2 and the switching transistor 4, a two phases signal generator circuit 6 transmitting two gate signals GA and GB to be input to gates of the switching transistors 3 and 4 for turning ON/OFF and having control input, and a burst signal generator circuit 5 connected to the control input of the two phase signal generator circuit 6 and transmitting a pulse output B having a variable duty ratio. It should be noted that the secondary side of the piezoelectric transformer 7 is connected to a load 8.

The two phase signal generator circuit 6 generates a signal having a frequency in the vicinity of a resonance point of the piezoelectric transformer. The piezoelectric transformer 7 effects control so that a constant voltage or constant current will be supplied for the load 8.

The circuit shown in FIG. 8 turns ON and OFF the switching transistors 3 and 4 and generates alternating two half-wave sine waves OA and OB having approximately three times the of amplitude to a power source voltage for driving the piezoelectric transformer 7. By supplying a drive voltage alternately to the piezoelectric transformer 7, an equivalent operation to that driven by a sine wave having both of positive and negative amplitudes is provided. Therefore, the shown inverter does not require two power sources respectively for supplying positive and negative currents. Also, since the half-wave sine wave can be obtained by relatively simple circuit construction, the inverter can be realized with simplified construction.

Operational waveforms of the circuit shown in FIG. 8 are shown in FIG. 9. In FIG. 9, during illuminating period, a burst signal B is held a low level. At a timing t2, a gate signal GA becomes a high level to turn ON the switching transistor 3. Then, a current flows through the inductor 1. Thus, an energy is accumulated in the inductor 1.

At a timing t3, the gate signal GA becomes the low level and the gate signal GB becomes the high level to turn OFF the switching transistor 3. At this timing, the energy accumulated in the inductor 1 is generated on the drain of the switching transistor 3 as the half-wave sine wave OA having amplitude determined by resonation of the inductor 1 and the input capacity of the piezoelectric transformer 7. At this time, the switching transistor 4 is turned ON. Then, the current flows in the inductor 2.

At a timing t4, the switching transistor 4 is turned OFF. Then, the energy accumulated in the inductor 2 is generated on the drain of the switching transistor 4 as the half-wave sine wave OB having amplitude determined by resonation of the inductor 2 and the input capacity of the piezoelectric transformer 7.

At the timing t2, the half-wave sine wave OA is 0, and at the timing t3, the half-wave sine wave OB is 0. By setting the inductors 1 and 2 and the input capacity of the piezoelectric transformer 7 for establishing 0 volt switching, the driving waveform as viewed from the primary side of the piezoelectric transformer 7 can be equivalent to sine wave.

When the burst signal B becomes the high level at the timing t1, the two phase signal generator circuit 6 turns the gate signals GA and GB of the switching transistors 3 and 4 the low levels, simultaneously to temporarily interrupt operation of the circuit. Variation of the luminance in illumination of the cold cathode fluorescent lamp is performed by varying the ratio of illumination period and extinction period. This can be realized by varying the duty ratio of the burst signal B.

In this circuit, since the current always flows through either one of the inductor 1 or 2 at any timing of turning the burst signal B into the high level, the energy accumulated in the inductors 1 or 2 at this timing appears on half-wave sine waves OA and OB as high voltage surge voltage VS. Therefore, it becomes necessary to employ high voltage transistors as the switching transistors 3 and 4 for resisting to the surge voltage VS.

On the other hand, in order to use low voltage transistors as the switching transistors, it becomes necessary to restrict generation of the surge voltage. A typical method for this purpose is a method employing a Zener diode. This method has been disclosed in Japanese Unexamined Patent Publication (Kokai) No. Showa 59-74728. As shown in FIG. 10, this method is constructed to connect the Zener diode having a reverse recovery time shorter than or equal to 3 [μsec] in parallel to the collector-emitter of the switching transistor. By this, the surge voltage can be restricted by the Zener voltage with restricting turn on loss of the transistor. The operation waveform in the case where the circuit of FIG. 8 is applied is shown in FIG. 11. FIG. 11 shows the waveform in the vicinity of the timing where the burst signal B turned into a high level.

As shown, even when the burst signal B is tuned from a low level to the high level at a timing t1, the surge voltage can be restricted by the Zener voltage Vz. It should be noted that, in the drawing, V denotes a power source voltage.

In the conventional piezoelectric transformer driver circuit of FIG. 8, when the luminance adjustment is performed by the burst control, if the control signal B is input as shown in FIG. 9, the two phase signal generator circuit 6 turns OFF the two switching transistors 3 and 4, simultaneously. At this time, the energy accumulated in the inductors 1 and 2 becomes high voltage surge voltage VS and is supplied to the drains of the switching transistors 3 and 4. For this purpose, high voltage transistors have to be employed as the switching transistors 3 and 4 for resisting against the surge voltage. However, the transistor having high withstanding voltage has greater ON resistance, and the element per se becomes large size and high cost. Thus, it results in increasing of circuit loss, increasing of size and cost.

On the other hand, as shown in FIG. 10, by connecting the switching transistor in parallel to the Zener diode, the surge voltage can be restricted. However, as shown in FIG. 8, the following inconvenience is encountered in employing the resonance type driver circuit. Namely, in general, junction capacity of the Zener diode is several tens to several hundreds [pF]. In case of the circuit shown in FIG. 10, the junction capacity of the Zener diode is connected in parallel to the input capacity of the piezoelectric transformer 7 to cause significant deviation for resonance condition of the inductor 1 or 2 and the input capacity of the piezoelectric transformer 7.

When this method is employed in the piezoelectric transformer drive circuit of FIG. 10, it becomes necessary to connect the Zener diodes in parallel to the switching transistors 3 and 4. However, when fluctuation is present in junction capacities, the half-wave sine waves OA and OB do not match with each other to make it not possible to drive the piezoelectric transformer 7 with an ideal sine wave to lower efficiency of the inverter.

SUMMARY OF THE INVENTION

The present invention has worked out for solving the drawbacks in the prior art. Therefore, it is an object of the present invention to provide a piezoelectric transformer driver circuit which permits the employment of a transistor having low withstanding voltage.

According to the first aspect of the invention, a piezoelectric transformer driver circuit comprises:

first and second switching transistors operated to alternately turn ON and OFF by an external control voltage, and driving a primary side of a piezoelectric transformer which has a secondary side connected to a load;

first and second inductors provided corresponding to the first and second switching transistors and supplying a power source to respectively corresponding switching transistors;

first and second capacitors respectively having one electrode connected to respective one of electrodes of the first and second inductors; and a third switching transistor situating the other electrodes of the first and second capacitors at a ground voltage upon completion of ON/OFF operation of the first and second switching transistors.

According to the second aspect of the invention, a piezoelectric transformer driver circuit comprises:

first and second switching transistors operated to alternately turn ON and OFF by an external control voltage, and driving a primary side of a piezoelectric transformer which has a secondary side connected to a load;

first and second inductors provided corresponding to the first and second switching transistors and supplying a power source to respectively corresponding switching transistors; and an attenuation circuit for gradually attenuating external control voltage upon completion of ON/OFF operation of the first and second switching transistors.

BRIEF DESCRIPTION OF THE DRAWINGS

The present invention will be understood more fully from the detailed description given herebelow and from the accompanying drawings of the preferred embodiment of the invention, which, however, should not be taken to limit the present invention, but are for explanation and understanding only.

In the drawings:

FIG. 3 is a waveform showing operation of respective portions of FIG. 1;

DESCRIPTION OF THE PREFERRED EMBODIMENT

The preferred embodiments of the present invention will be discussed hereinafter in detail with reference to the accompanying drawings, particularly to FIGS. 1 to 7. In the following description, numerous specific details are set forth in order to provide a thorough understanding of the present invention. It will be obvious, however, to those skilled in the art that the present invention may be practiced without these specific details. In other instances, well-known structures are not shown in detail in order to unnecessary obscure the present invention.

Figure 1:
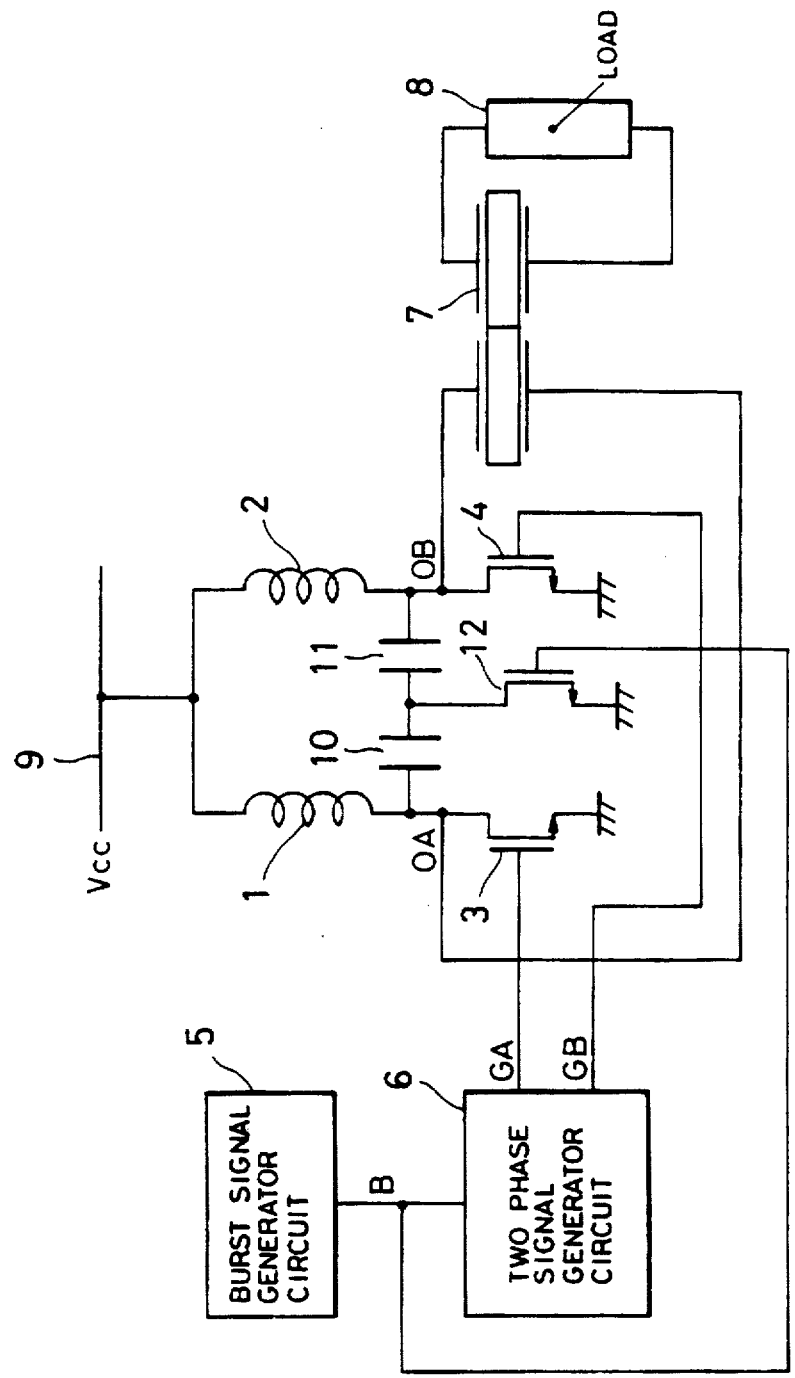
FIG. 1 is a circuit diagram showing a construction of the first embodiment of a piezoelectric transformer driver circuit according to the present invention.

FIG. 1 is a circuit diagram showing the first embodiment of a piezoelectric transformer driver circuit according to the present invention. Like portions similar to those in FIG. 8 will be represented by like reference numerals. In the drawings, the first embodiment of a piezoelectric transformer driver circuit according to the present invention is constructed with an inductor 1 connected to a power source 9 at one end, a switching transistor 3 connected between the other end of the inductor 1 and the ground, an inductor 2 connected to the power source 9 at one end, a switching transistor 4 connected between the other end of the inductor 2 and the ground, capacitors 10 and 11 connected in series between a junction of the inductor 1 and the switching transistor 3 and a junction of the inductor 2 and the switching transistor 4, and a switching transistor 12 connected between a junction between the capacitors 10 and 11 and the ground.

On the other hand, the shown embodiment of the piezoelectric transformer driver circuit according to the present invention is constructed with a piezoelectric transformer 7 connected between a junction of the inductor 1 and the switching transistor 3 and a junction of the inductor 2 and the switching transistor 4, a two phase signal generator circuit 6 outputting two gate signals GA and GB alternately turning ON and OFF, and having a control input, two signals GA and GB being input to the switching transistors 3 and 4, and ON and OFF of the two signals GA and GB being controlled by the control input, and a burst signal generator circuit outputting a burst signal B as pulse output having a variable duty ratio for inputting to the control input of the two phase signal generator circuit and the gate of the switching transistor 12.

Figure 2A:
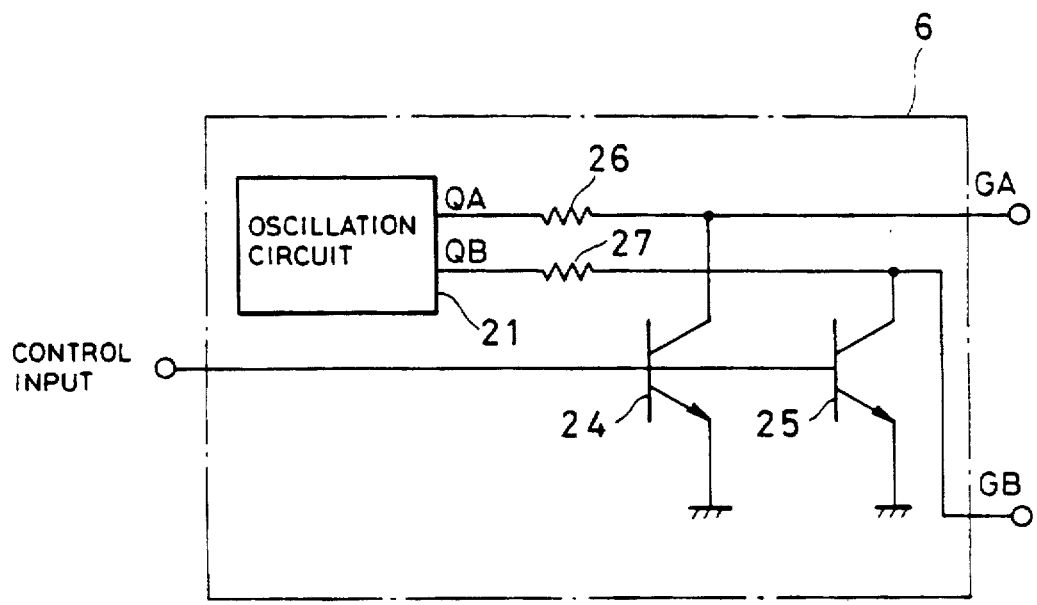
FIG. 2A is a circuit diagram showing an example of construction of a two phase signal generator circuit of FIG. 1.

FIG. 2A shows one example of the two phase signal generator circuit. In FIG. 2A, in the two phase signal generator circuit 6, output signals QA and QB of oscillation circuit 21 having two alternating outputs are connected to collectors of transistors 24 and 25 via resistors 26 and 27, respectively. Then, the voltage at the junction point are gate signals GA and GB as the outputs of the two phase signal output circuit 6. To the control input, the output of the burst signal generator circuit 5 of FIG. 1, namely the burst signal B, is applied. Resistors 26 and 27 are inserted for preventing the signals GA and GB falling at an intermediate potential due to mutual drawing of the current by an output circuit in the oscillation circuit 21 and the transistor 24 or 25 when the transistors 24 and 25 are turned ON in response to inputting of the burst signal B.

Figure 2B:
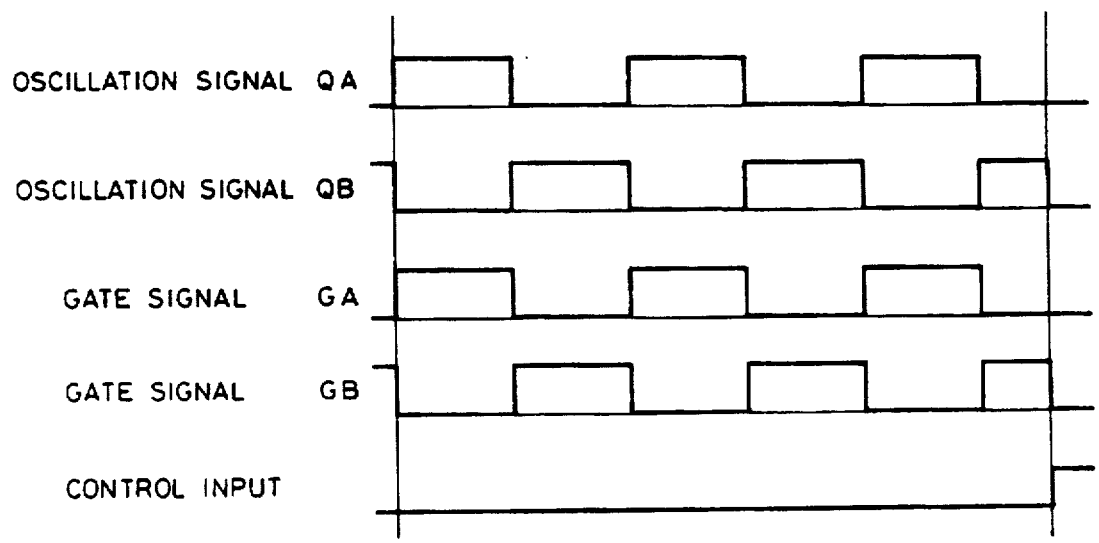
FIG. 2B is a waveform showing operation of respective portions of FIG. 2A.

With such construction, from the oscillation circuit 21, the oscillation signals QA and QB alternately turning into a high level shown in FIG. 2B are output. When the control input is a low level, the gate signal GA corresponding to the oscillation signal QA, is output depending upon the oscillation signal QA, and the gate signal GB depending corresponding to the oscillation signal QB. When the control signal is the high level, the transistors 24 and 25 are turned ON, and the gate signals GA and GB are not fed.

Next, the operation of the circuit of FIG. 1, will be discussed with reference to FIG. 3. In FIG. 3, when the pulse output of the burst signal generator circuit 5 is turned into the high level, both of the transistors 24 and 25 shown in FIG. 2 are turned ON. Therefore, the gate signals GA and GB as outputs of the two phase signal generator circuit 6 fall down to the ground potential (grounding potential). By this, the switching transistors 3 and 4 are turned OFF. At the same time, the transistor 12 for discharging energy is turned ON by the burst signal B as the output of the burst signal generator circuit 5. At this time, the energy accumulated in the inductors 1 and 2 are supplied to the piezoelectric transformer 7 as half-wave sine wave OA and OB determined by resonance of the inductor 1 and the capacitor 10 or the inductor 2 and the capacity 11. By determining the values of the capacitors 10 and 11 to make the output voltage due to resonance sufficiently small, the surge voltage can be suppressed to lower the required voltage for the switching transistors 3 and 4.

Figure 8:
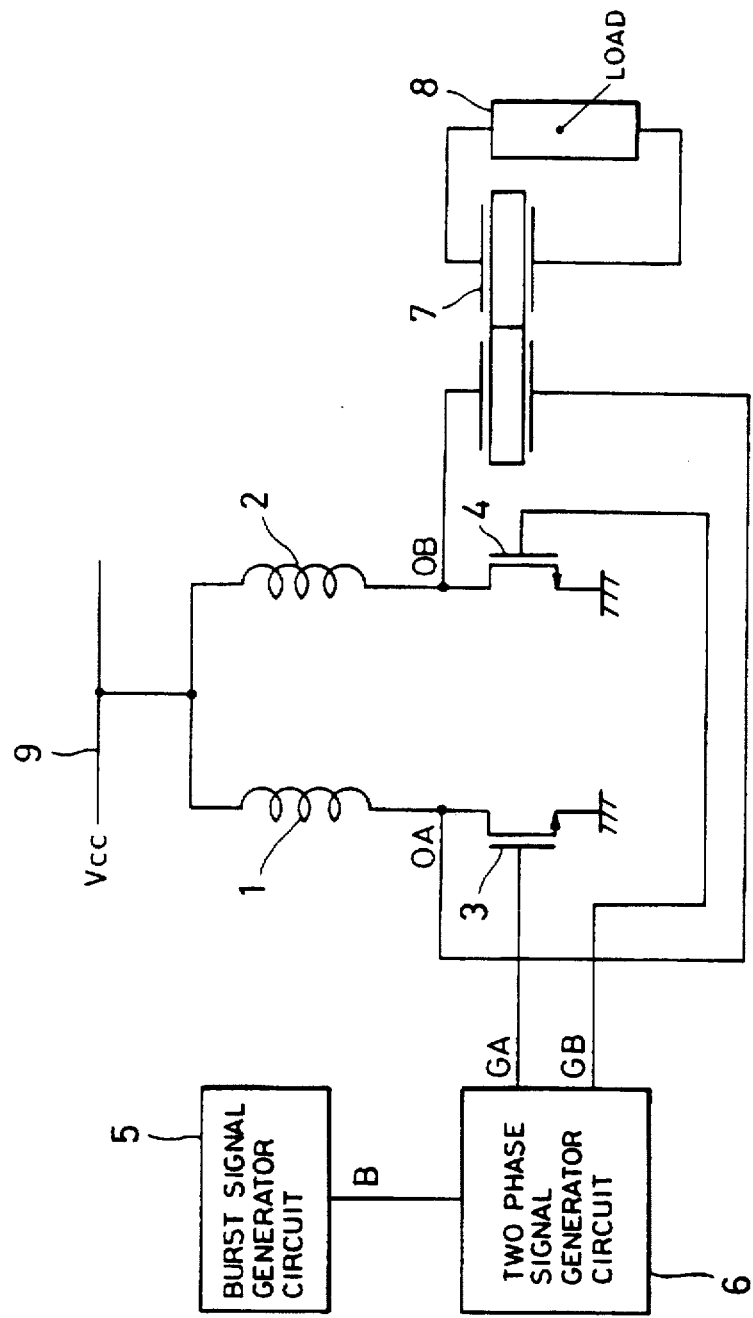
FIG. 8 is a circuit diagram showing the construction of the conventional transformer driver circuit.
Figure 9:
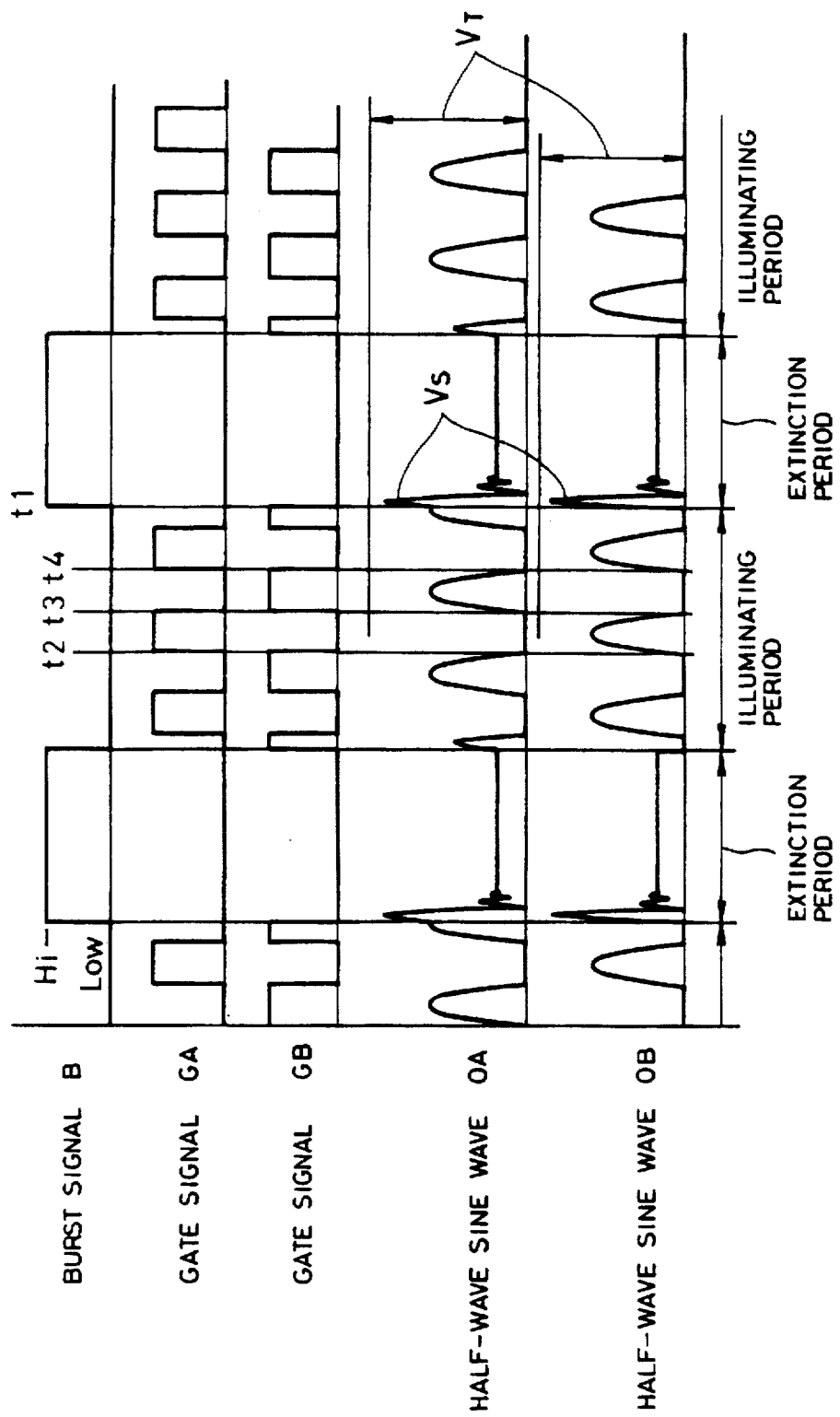
FIG. 9 is a waveform showing operations of respective portions of FIG. 8.

In the conventional circuit shown in FIG. 8, when the values of the inductors 1 and 2 were 180 [μH], and input capacity of the piezoelectric transformer 7 was about 2600 [pF], the generated surge voltage was about 90 |V|. Therefore, as the switching transistors 3 and 4, the transistor having about 180 [V] of withstanding voltage has to be used to provide double the margin of the surge voltage. This corresponds to VT in FIG. 3.

In contrast to this, in the shown embodiment of the inverter shown in FIG. 1, in the similar condition to the conventional circuit, and the capacities of the capacitors 10 and 11 were 100 [pF], the surge voltage was lowered to about 60 [V]. Therefore, even when double the margin is provided for the withstanding voltage required for the switching transistors 3 and 4 becomes 120 [V]. This is VT2 in FIG. 3. Furthermore, by setting the capacities of the capacitors 10 and 11 at 300 [pF], the generated surge voltage was lowered to about 25 [V].

As set forth above, by setting capacities of the capacitors 10 and 11 to sufficiently lower the surge voltage, the transistors having low withstanding voltage can be used as the switching transistors 3 and 4. The transistor having low withstanding voltage has smaller ON resistance and is compact in size and low in cost. Therefore, employing a low voltage transistor is remarkably effective for higher efficiency, down-sizing and lower cost of the shown driver circuit.

Figure 10:
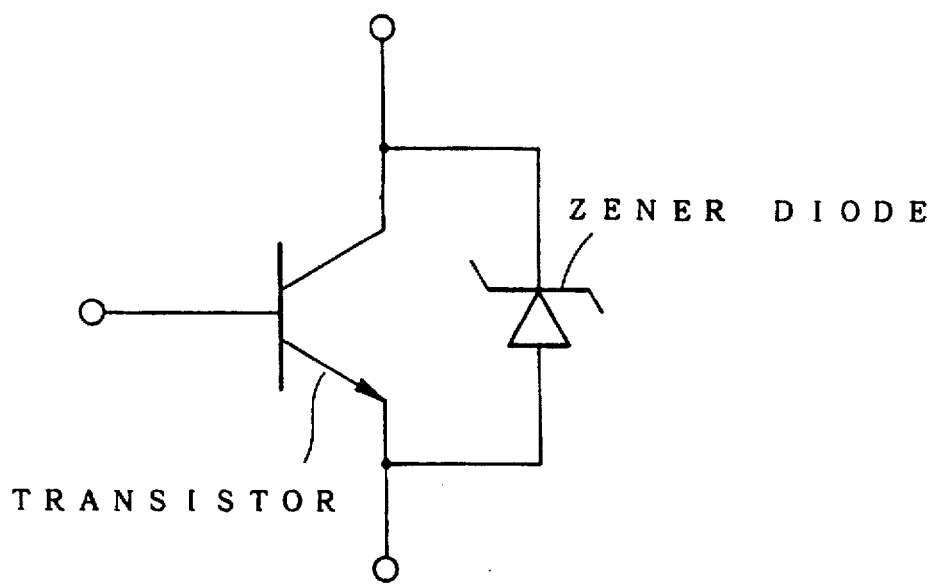
FIG. 10 is a circuit diagram showing a construction of a surge restriction circuit in Japanese Unexamined Patent Publication No. Showa 59-74728.
Figure 11:
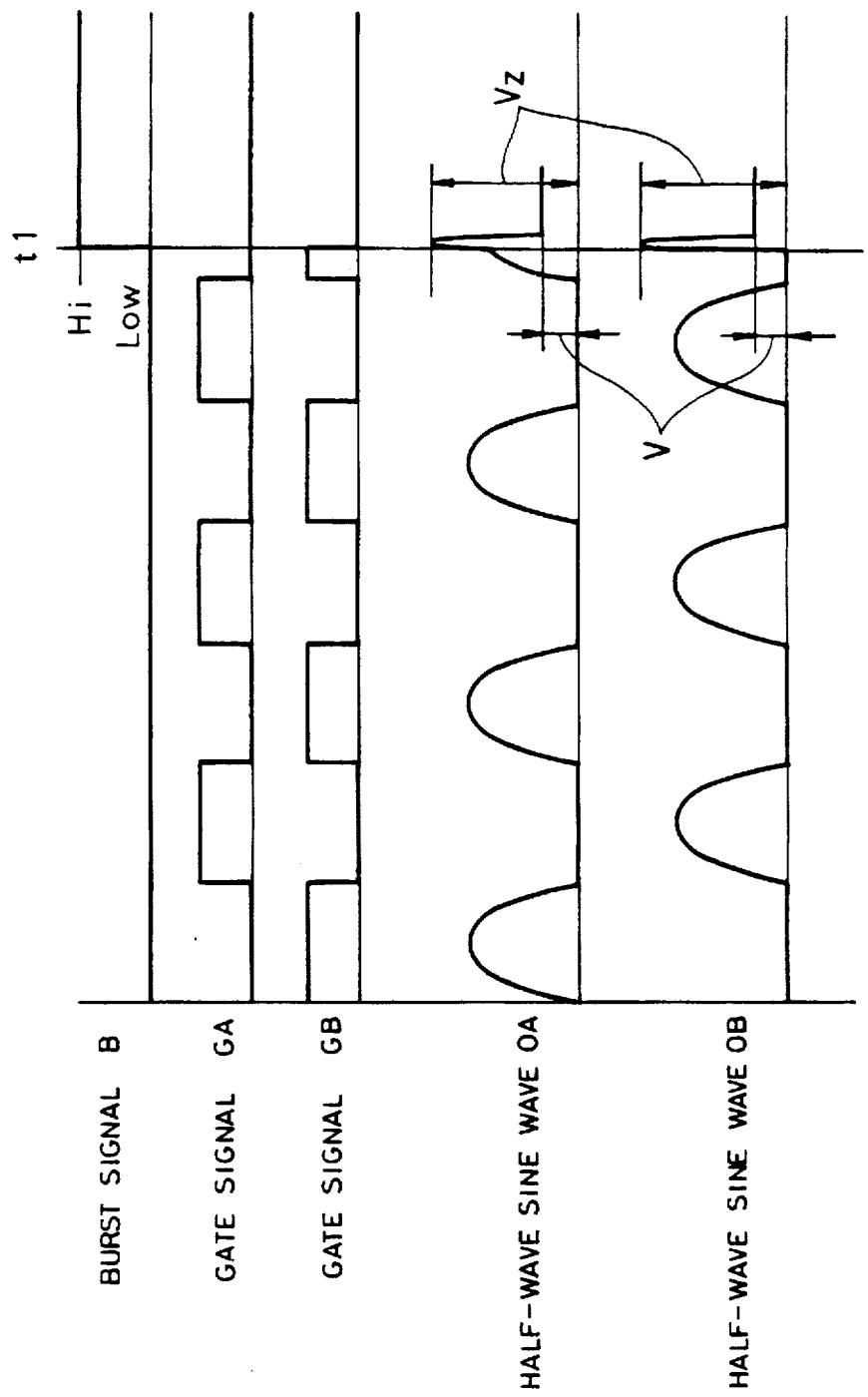
FIG. 11 is an operation wave form in the case where the circuit of FIG. 10 is applied to the circuit of FIG. 8.

On the other hand, when the Zener diode is employed for restricting the surge voltage as in the construction proposed in Japanese Unexamined Patent Publication No. Showa 59-74728, shown in FIG. 10, a problem of fluctuation of the resonating condition of the driver circuit can be encountered due to fluctuation of the junction capacity of the Zener diode. In contrast to this, since the shown embodiment employs the capacitor, the capacitance value can be precisely selected to make fluctuation of the resonating condition smaller.

Figure 4:
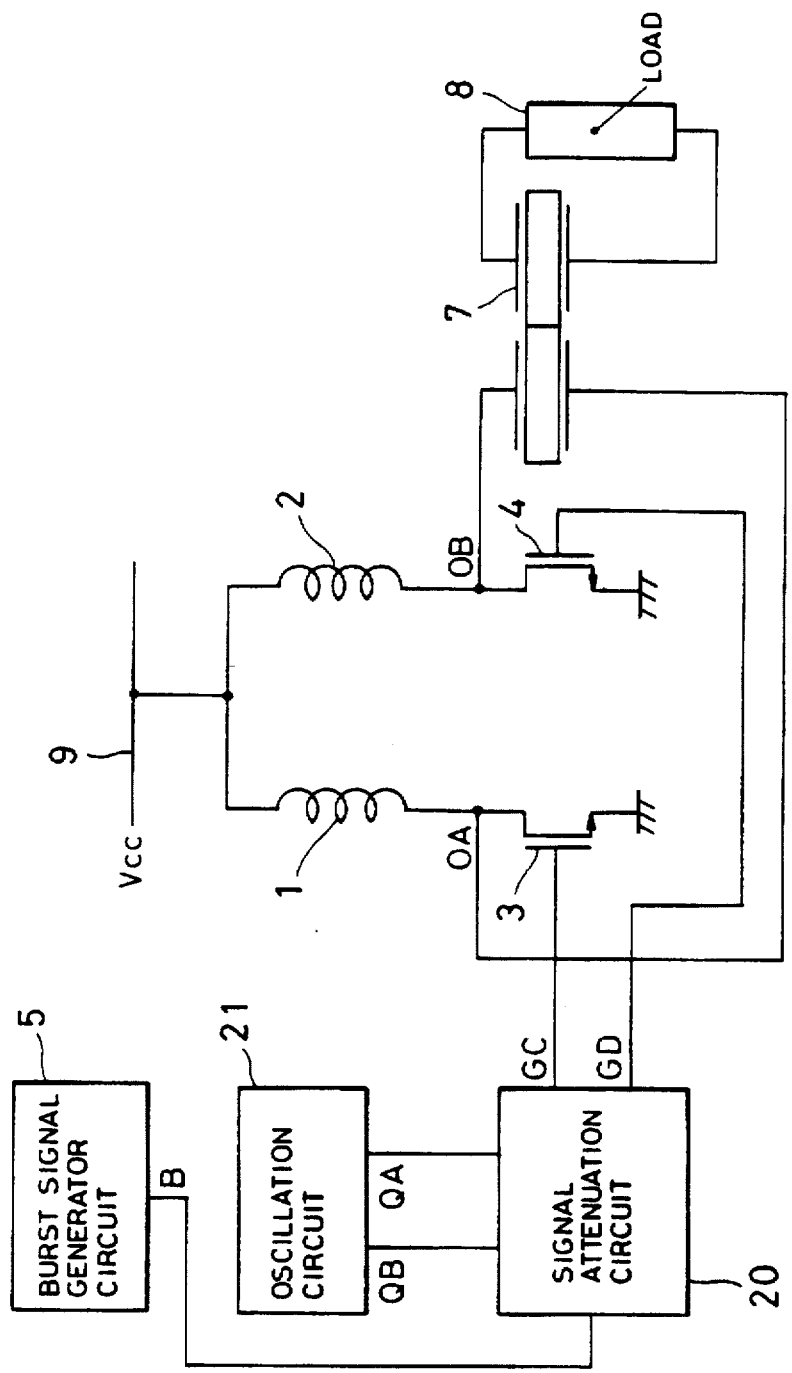
FIG. 4 is a circuit diagram showing a construction of the second embodiment of the piezoelectric transformer driver circuit according to the present invention.

In addition, when the Zener diode is employed, while the driver circuit is in the operating condition, the current flows through the junction capacity of the Zener diode to inherently increase circuit loss. In contrast to this, the shown embodiment can minimize circuit loss by selecting the capacity having small a equivalent series resistance. FIG. 4 is a circuit diagram showing the construction of the second embodiment of the piezoelectric transformer driver circuit according to the present invention. Like portions to those in FIGS. 1 and 8 will be represented by like reference numerals. In FIG. 4, the second embodiment of the piezoelectric transformer driver circuit is constructed with an inductor 1 connected to a power source 9 at one end, a switching transistor 3 connected between the other end of the inductor 1 and the ground, an inductor 2 connected to the power source 9 at one end, a switching transistor 4 connected between the other end of the inductor 2 and the ground, an oscillation circuit 21 outputting oscillation signals QA and QB alternately turning ON and OFF, which two outputs are connected to inputs of a signal attenuation circuit 20, the burst signal generator circuit 5 feeding the burst signal B having variable duty ratio, which burst signal B is applied to a control input of the signal attenuation circuit 20, and the signal attenuation circuit 20 having two inputs, two outputs feeding two gate signals GC and GD and one control input, which two gate signals GC and GD are fed to the gates of the switching transistors 3 and 4.

Figure 5:
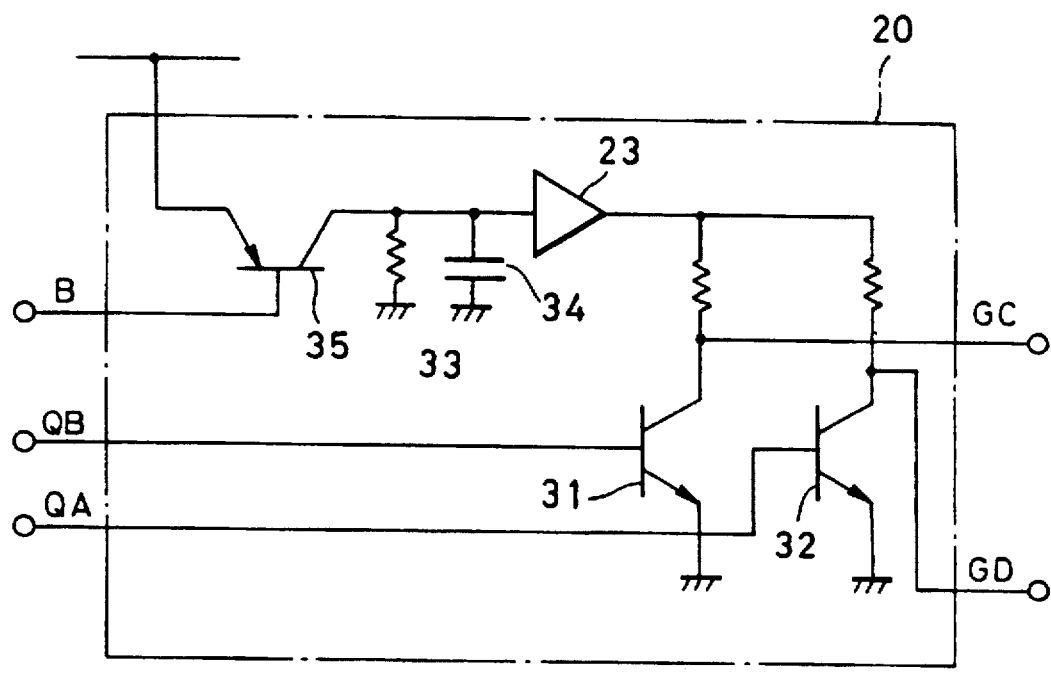
FIG. 5 is a circuit diagram showing an example of construction of a signal attenuation circuit in FIG. 4.

FIG. 5 shows one example of the signal attenuation circuit 20. The shown circuit is designed to control the gate signals GC and GD to turn ON and OFF according to the oscillation signals QA and QB while the burst signal B is maintained at the low level. The amplitudes of the gate signals GC and GD is determined by the voltage on both ends of the capacitor 34 applied through a buffer 23. When the burst signal B is turned into High level, a transistor 35 is turned OFF. Then, the voltage on both ends of the capacitor 34 is attenuated with a given time constant determined the resistor 33 and the capacitor 34. Accordingly, the gate signals GC and GD are also attenuated with the similar time constants.

Figure 6:
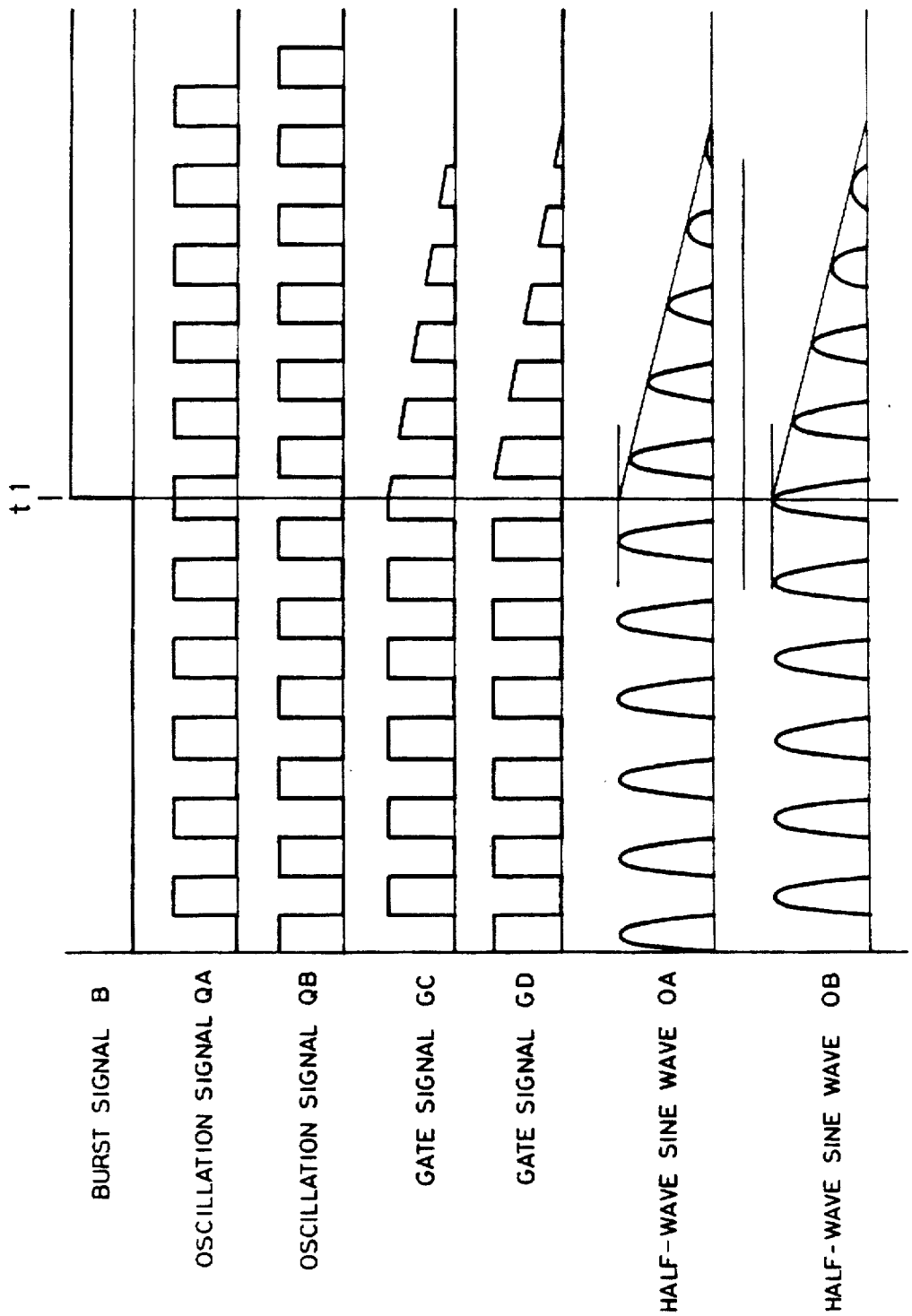
FIG. 6 is a waveform showing operations at respective portions of FIG. 4.
Figure 7:
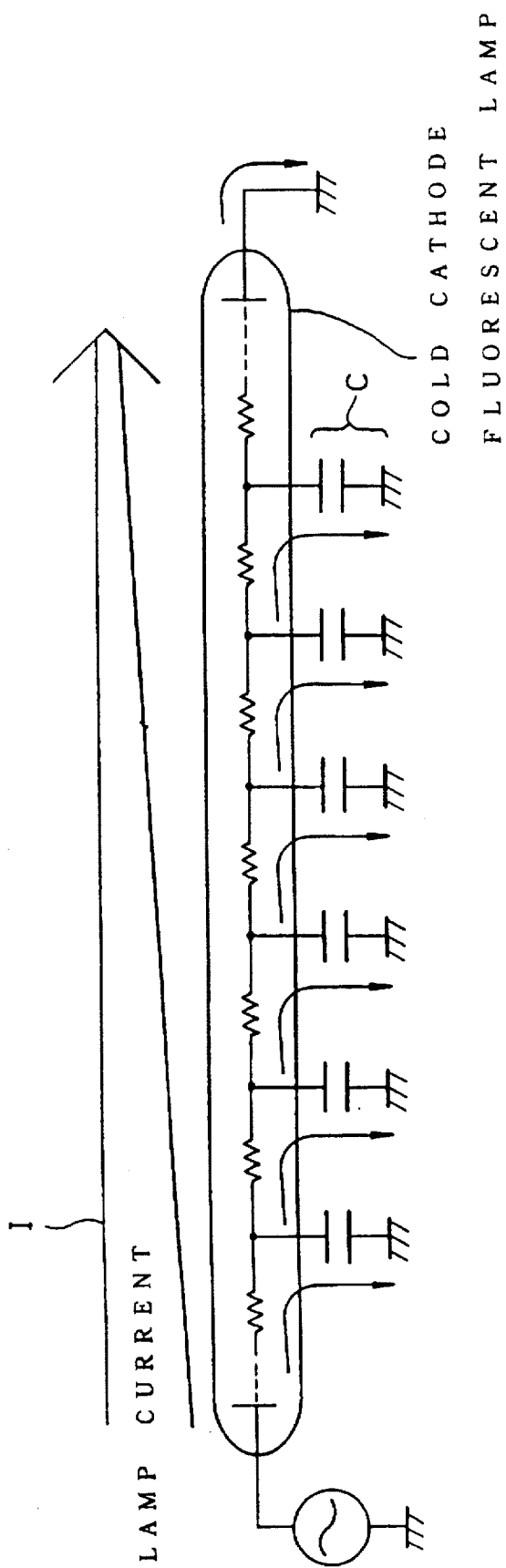
FIG. 7 is an illustration showing the operating condition of a cold cathode fluorescent lamp.

The operation of the circuit of FIG. 4 will be discussed hereinafter with reference to FIG. 6. In FIG. 6, like portions to FIGS. 4 and 5 will be identified by like reference numerals.

When the signal B as control input of the signal attenuation circuit 20 turns into the high level at the timing t1, the signal attenuation circuit 20 transmit the gate signals GC and GD to the switching transistors 3 and 4 with attenuating the signal level with the time constant determined by the resistor 33 and the capacitor 34 in FIG. 5. Due to lowering of the signal level of the gate signals, the drain current of the switching transistors 3 and 4 are gradually reduced. Thus, the energy accumulated in the inductors 1 and 2 is gradually reduced. Therefore, the half-wave sine waves OA and OB are also reduced gradually. Even after the timing t1, the half-wave sine waves OA and OB are applied to the transformer 7. However, it merely results in slight variation of the luminance and will not raise any significant problem.

In the principle of the shown embodiment, the switching transistors 3 and 4 will never turned OFF simultaneously, no surge voltage will be generated. Therefore, the withstanding voltages of the switching transistors 3 and 4 may be determined only in consideration of the voltages of the half-wave sine waves OA and OB. Thus, the transistors having lower withstanding voltage can be employed. Since the transistor having lower withstanding voltage has a smaller ON resistance in comparison with the high voltage transistor, and is compact in size and low in cost. Therefore, employment of the transistors having lower withstanding voltage should be remarkably effective in achieving higher efficiency, smaller size and lower cost in the shown driver circuit.

It should be obvious to those skilled in the art that while the foregoing discussion has been given for the case where the load is the cold cathode fluorescent lamp, the present invention is equally applicable for other loads.

As set forth above, in the present invention, since the surge voltage to be generated when two switching transistors are turned OFF simultaneously can be restricted by providing the energy discharging capacitor in the driver circuit for driving the piezoelectric transformer, the switching transistor having low withstanding voltage can be employed. Also, according to the present invention, by providing a circuit gradually lowering the gate voltages of two switching transistors, the energy accumulated in the inductors can be gradually reduced to prevent the two switching transistors from being shut OFF simultaneously to eliminate occurrence of the surge voltage. Therefore, the switching transistor having low withstanding voltage can be employed. Since the switching transistor having low withstanding voltage has a smaller ON resistance at the same current capacity, is smaller in size and lower in cost. Therefore, loss can be reduced with reducing size and cost for the piezoelectric transformer driver circuit. Furthermore, since it is not necessary to employ the Zener diode which has large junction capacity and has large fluctuation, fluctuation of the resonating condition of the driver circuit can be made smaller to reduce loss of the piezoelectric transformer driver circuit.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A piezoelectric transformer driver circuit comprising:
   first and second switching transistors operated to alternately turn ON and OFF by an external control voltage, and driving a primary side of a piezoelectric transformer which has a secondary side connected to a load;
   first and second inductors provided corresponding to said first and second switching transistors and supplying a power source to respectively corresponding switching transistors;
   first and second capacitors each respectively having one electrode connected to respective one of electrodes of said first and second inductors; and
   a third switching transistor situating the other electrodes of said first and second capacitors at a ground voltage upon completion of ON/OFF operation of said first and second switching transistors.

2. A piezoelectric transformer driver circuit as set forth in claim 1, wherein said external control voltage is consisted of mutually alternating a first gate signal to be applied to said first switching transistor and a second gate signal to be applied to said second switching transistor.

3. A piezoelectric transformer driver circuit as set forth in claim 2, which further comprises means for placing said first and second gate signals in outputting condition when a voltage level of an external input signal is a first level and placing said first and second gate signals in shut OFF condition when the voltage level of said external input signal is a second level, and while the voltage level of said external input signal is said second level, said third switching transistor is placed in ON condition to set the potential at the other electrode of said first and second capacitors at the ground voltage.

4. A piezoelectric transformer driver circuit comprising:
   piezoelectric transformer having a secondary side connected to a load;
   first and second switching transistors operated to alternately turn ON and OFF by an external control voltage, and driving a primary side of said piezoelectric transformer;
   first and second inductors provided corresponding to said first and second switching transistors and supplying a power source to respectively corresponding switching transistors;

first and second capacitors each respectively having one electrode connected to respective one of electrodes of said first and second inductors; and a third switching transistor situating the other electrodes of said first and second capacitors at a ground voltage upon completion of ON/OFF operation of said first and second switching transistors.

5. A piezoelectric transformer driver circuit as set forth in claim 4, wherein said external control voltage consists of mutually alternating a first gate signal to be applied to said first switching transistor and a second gate signal to be applied to said second switching transistor.

6. A piezoelectric transformer driver circuit as set forth in claim 5, which further comprises means for placing said first and second gate signals in outputting condition when a voltage level of an external input signal is a first level and placing said first and second gate signals in shut OFF condition when the voltage level of said external input signal is a second level, and while the voltage level of said external input signal is said second level, said third switching transistor is placed in ON condition to set the potential at the other electrode of said first and second capacitor at the ground voltage.

7. A piezoelectric transformer driver circuit comprising:

first and second switching transistors operated to alternately turn ON and OFF by an external control voltage, and driving a primary side of a piezoelectric transformer which has a secondary side connected to a load;

first and second inductors provided corresponding to said first and second switching transistors and supplying a power source to respectively corresponding switching transistors; and an attenuation circuit for attenuating the external control voltage upon completion of ON/OFF operation of said first and second switching transistors, wherein said attenuation circuit includes a time constant circuit for attenuating said external control voltage toward a ground voltage in response to completion of ON and OFF operation of said first and second switching transistors.

8. A piezoelectric transformer driver circuit as set forth in claim 7, wherein said external control voltage is consisted of mutually alternating a first gate signal to be applied to said first switching transistor and a second gate signal to be applied to said second switching transistor.

9. A piezoelectric transformer driver circuit as set forth in claim 8, which further comprises means for placing said first and second gate signals in outputting condition when a voltage level of an external input signal is a first level and placing said first and second gate signals in shut OFF condition when the voltage level of said external input signal is a second level, and said attenuation circuit for attenuating said external control voltage toward the ground voltage while the voltage level of said external input signal is in said second level.

10. A piezoelectric transformer driver circuit as set forth in claim 8, which further comprises means for placing said first and second gate signals in outputting condition when a voltage level of an external input signal is a first level and placing said first and second gate signals in shut OFF condition when the voltage level of said external input signal is a second level, and while the voltage level of said external input signal is said second level, said attenuation circuit for gradually attenuating external control voltage toward a ground voltage while the voltage level of said external input signal is in said second level.

11. A piezoelectric transformer driver circuit comprising:

a piezoelectric transformer having a secondary side connected to a load;

first and second switching transistors operated to alternately turn ON and OFF by an external control voltage, and driving a primary side of the piezoelectric transformer;

first and second inductors provided corresponding to said first and second switching transistors and supplying a power source to respectively corresponding switching transistors; and an attenuation circuit for attenuating the external control voltage upon completion of ON/OFF operation of said first and second switching transistors, wherein said attenuation circuit includes a time constant circuit for attenuating said external control voltage toward a ground voltage in response to completion of ON and OFF operating of said first and second switching transistors.

12. A piezoelectric transformer driver circuit as set forth in claim 11, wherein said external control voltage is consisted of mutually alternating a first gate signal to be applied to said first switching transistor and a second gate signal to be applied to said second switching transistor.

13. A piezoelectric transformer driver circuit as set forth in claim 12, which further comprises means for placing said first and second gate signals in outputting condition when a voltage level of an external input signal is a first level and placing said first and second gate signals in shut OFF condition when the voltage level of said external input signal is a second level, and said attenuation circuit for gradually attenuating external control voltage toward the ground voltage while the voltage level of said external input signal is in said second level.

14. A piezoelectric transformer driver circuit as set forth in claim 12, which further comprises means for placing said first and second gate signals in outputting condition when a voltage level of an external input signal is a first level and placing said first and second gate signals in shut OFF condition when the voltage level of said external input signal is a second level, and while the voltage level of said external input signal is said second level, said attenuation circuit for gradually attenuating external control voltage toward the ground voltage while the voltage level of said external input signal is in said second level.

* * * * *